United States Patent [19]

McPherson et al.

[11] Patent Number: 4,714,873
[45] Date of Patent: Dec. 22, 1987

[54] MICROWAVE NOISE MEASURING APPARATUS

[75] Inventors: Hugh McPherson, Tweeddale; Jeffrey Stoker, Edinburgh, both of Scotland

[73] Assignee: Ferranti, plc, Cheadle, England

[21] Appl. No.: 897,800

[22] Filed: Aug. 19, 1986

[30] Foreign Application Priority Data

Aug. 23, 1985 [GB] United Kingdom ............... 8521184

[51] Int. Cl.$^4$ .................... G01R 23/16; G01S 7/40
[52] U.S. Cl. .......................... 324/57 N; 324/83 Q; 342/174
[58] Field of Search ............. 324/57 N, 58 C, 58.5 C, 324/83 Q; 342/173, 174; 455/115

[56] References Cited

U.S. PATENT DOCUMENTS

| | | | |
|---|---|---|---|
| 2,686,303 | 8/1954 | Harrison | 342/173 |
| 2,874,380 | 2/1959 | Fuller et al. | 342/173 |
| 2,902,649 | 9/1959 | Bachmann | 342/173 X |
| 4,634,962 | 1/1987 | Banura et al. | 324/57 N |

Primary Examiner—T. H. Tubbesing
Attorney, Agent, or Firm—Dennis P. Clarke

[57] ABSTRACT

Apparatus for measuring the phase noise content of a microwave signal source (10) includes a microwave cavity (22) resonant at a fixed frequency, signal generating means (23) operable to generate a frequency representing the difference between the source frequency and that of the resonant cavity, and mixing means (20) for combining the outputs of the source and the signal generating means. The output from the resonant cavity (22) is applied to a phase detector (15) together with a portion of the output of the mixing means (20) and the output of the phase detector (15) represents the phase noise content of the output of the microwave source (10). The signal generating means (23) includes a voltage-controlled oscillator the frequency of which is controlled by an output from the phase detector means (15) so as to maintain the output of the mixing means (20) at the resonant frequency of the microwave cavity (22).

6 Claims, 3 Drawing Figures

MICROWAVE NOISE MEASURING APPARATUS

This invention relates to microwave noise measuring apparatus intended particularly for the measurement of the phase noise content of a microwave signal source.

All microwave signal sources generate unwanted phase noise, that is noise in the form of random frequency variations about the source output frequency. Whilst the magnitude of the phase noise content of a signal may be small it may become significant, for example in doppler frequency radar systems. This is because the radar return applied to a doppler radar receiver may be very small and is in the form of a small change in frequency from that of the transmitted radar signal. It will be appreciated therefore that phase noise could lead to erroneous interpretations of doppler signals or mask them altogether.

In order to control or reduce the phase noise content of the output of a microwave signal source it is first necessary to be able to measure the phase noise. Several techniques are known for this, but these have disadvantages which affect their use and accuracy. The techniques described relate to single-frequency microwave sources of the type which may be tunable over only a few tens of MHz.

One technique involves cross-correlation between two microwave sources, one being the source under test and the other being a reference. The main problem with this technique is the difficulty of obtaining a reference source which is of significantly better performance than the source under test. As a result a reference source may not be available, and this technique is therefore of no use.

Other techniques exist which use only the source under test. One makes use of a delay line to which the output of the source is applied and a phase detector comparing the output of the delay line with the source output 90° out of phase with it. The delay line transforms frequency fluctuations into phase fluctuations and the phase detector converts these into voltage fluctuations at its output. Unfortunately such a system has low sensitivity due to the limited amount of input power which can be applied to the system.

A second technique which avoids this problem uses a tunable cavity resonator to provide a delay in place of the delay line. The cavity is tuned to the frequency of the signal source and has the effect of suppressing the source frequency whilst leaving the noise frequency signals. This enables greater power to be applied to the measuring system, thus increasing the sensitivity. The problems which arise from the use of this technique are associated with the use of a tunable resonant cavity. Firstly the cavity has to be returned for each source frequency, and this takes time. In addition the resonant frequency of the cavity may well be sensitive to mechanical vibration. Finally, all other components in the measuring system must have wide bandwidths to cover the tuning range which the system may have to cover.

It is an object of the present invention to provide apparatus for measuring the phase noise content of the output of a microwave signal source which requires only a single microwave source and which does not suffer from the problems set out above.

According to the present invention there is provided apparatus for measuring the phase noise content of the output of a microwave signal source, which includes a microwave cavity resonant at a fixed frequency differing from that of the source by between 1% and 10% of the cavity resonant frequency, signal generating means operable to generate a signal representing the difference between the frequency generated by the microwave signal source and the resonant frequency of the cavity, mixing means operable to combine the outputs of the microwave signal source and of the signal generating means to provide a signal having a frequency equal to the resonant frequency of the cavity for application thereto, and phase detector means responsive to an output from the cavity and to an output from the mixing means in phase quadrature therewith to provide a signal representing the phase noise content of the output of the microwave signal source.

The invention will now be described with reference to the accompanying drawings, in which.

Figure 1:
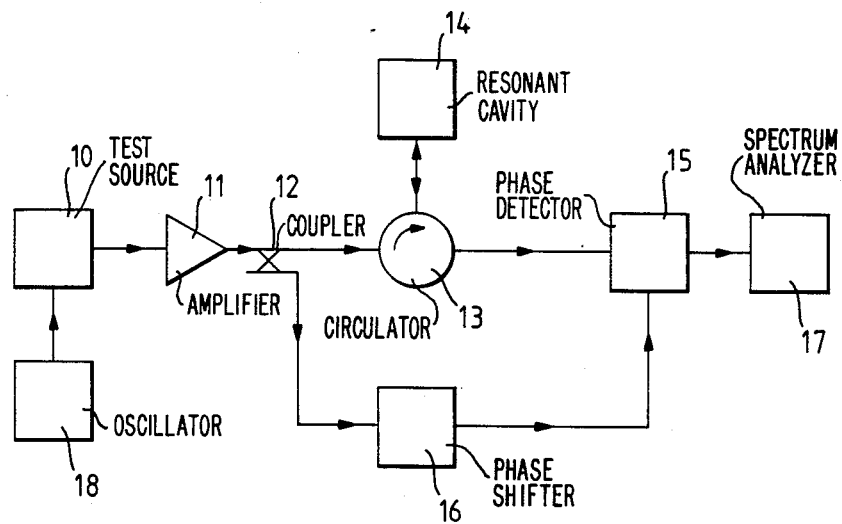
FIG. 1 shows a block diagram of known apparatus using a tunable resonant cavity.

Referring now to FIG. 1 a known phase noise measuring system includes the source under test 10 which applies a signal by way of a low noise amplifier 11, a 10 dB coupler 12 and a circulator 13 to a tunable resonant cavity 14. An output from the cavity 14 passes via the circulator 13 to a phase detector 15. The signal applied to the 10 dB coupler 12 is also applied by way of a phase shifter 16 to the phase detector 15, the phase shifter being arranged so that its output is 90° out of phase with the output of the resonant cavity. The output of the phase detector 15 is the output of the phase noise measuring system and may, for example, be applied to a spectrum analyzer 17. The analyzer is particularly useful if the source under test is frequency modulated by a low frequency oscillator 18.

In use, the resonant cavity 14 has to be tuned to the frequency of the source under test. The effect of the tuned cavity 14, so far as signals within the cavity bandwidth are concerned, is to transform any frequency fluctuations into phase fluctuations. The phase detector 15 converts these into voltage fluctuations which are applied to the spectrum analyzer 17. Any noise signals which are outside the cavity bandwidth are converted into amplitude modulation signals.

As has already been stated, one of the main disadvantages with the arrangement described above is that the cavity has to be retuned for each different frequency output from the source under test. The disadvantages resulting from this have already been set out.

Figure 2:
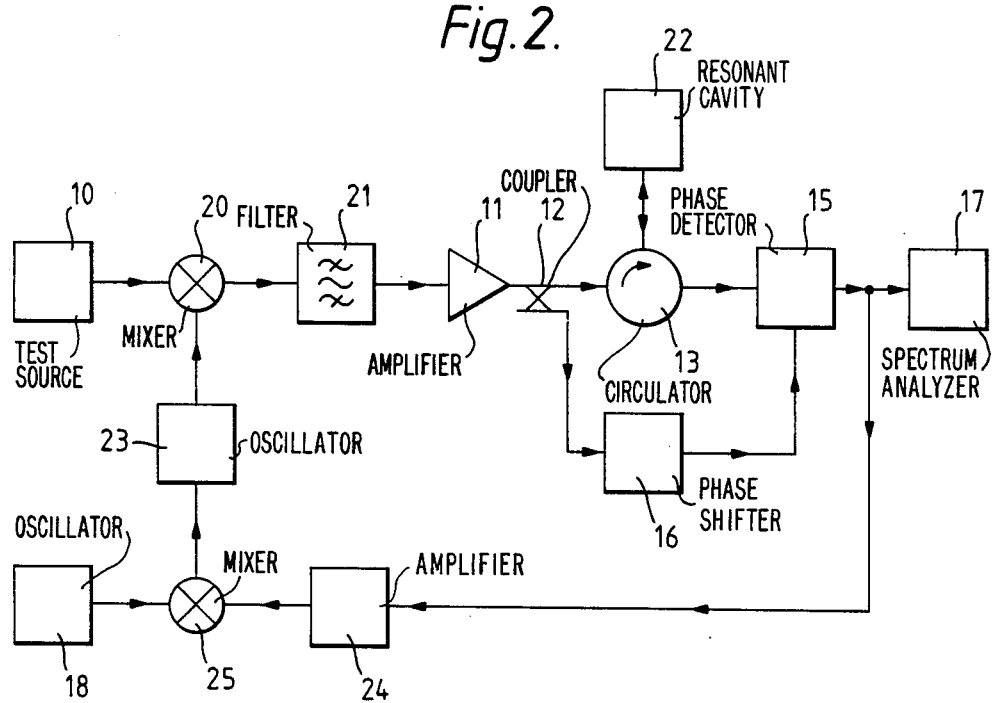
FIG. 2 is a block diagram of a first embodiment of the invention.

FIG. 2 shows one embodiment of a system according to the invention. Apart from the fact that a fixed frequency resonant cavity is used those parts of the system after the 10 dB coupler remain substantially unchanged. Circuit elements which were present in the embodiment of FIG. 1 are given the same reference numbers.

Referring to FIG. 2, the source under test 10 is connected by way of a balanced/double balanced mixer 20 and band-pass filter 21 to low noise amplifier 11 and hence to coupler 12. The coupler is connected, as before, to circulator 13, but the resonant cavity 22 is tuned to a fixed frequency. Phase detector 15 and phase shifter 16 are connected as before, and spectrum analyzer 17 may be used to inspect the output of the phase detector 15.

The mixer 20 also has applied to it the output of an intermediate-frequency oscillator 23. This generates a frequency which, when combined with the output of the source 10 produces a signal at the resonant frequency of the cavity 22. The frequency of the oscillator 23 is controlled by the output of the phase detector 15 by way of a d.c. control amplifier 24. The output of the dc amplifier 24 is applied to oscillator 23 through a mixer 25 to which may be added the output of a calibration oscillator 18. The oscillator 23 must be of a type which may be accurately tuned by an analog signal.

In operation the oscillator 23 is tuned to a frequency which will translate a particular source frequency to the resonant frequency of the tuned cavity 22. The band-pass filter 21 removes any unwanted signals generated by the mixing process whilst amplifier 11 raises the amplitude of the signal to the desired level.

The measuring section of the apparatus functions in the same way as in the previous embodiment. A dc signal produced by the phase detector 15 is fed back through the dc amplifier 24 to control the frequency of oscillation of oscillator 23.

Clearly any change in the frequency of the output of source 10 is dealt with by changing the frequency of oscillator 23, and the problems previously associated with a tunable resonant cavity are thus avoided.

There is a limit concerning how closely the source frequency may approach the resonant frequency of cavity. This arises from the fact that the mixing process carried out by mixer 20 generates spurious signals which must be removed by band-pass filter 21. The closer the source frequency approaches the cavity resonant frequency then the narrower must be the pass-band width of the filter. Practical filter design limits mean that the resonant frequency of the cavity must differ from the frequency generated by the source by at least 1% of the cavity frequency. For X-band working this means that the source frequency should not come closer than 50 MHz to the cavity resonant frequency. On the other hand, if the difference between the source frequency and the cavity resonant frequency becomes too large then the oscillator 23 will have to be the same type of microwave oscillator as the source itself. Therefore, again for practical reasons, the source frequency should not differ from that of the cavity by more than about 10% of the cavity resonant frequency. Again, for X-band sources, this means that the oscillator 23 requires a tuning range from about 50 MHz to about 16 Hz.

The low-frequency oscillator 18 shown in FIG. 2 may be used to superimpose a modulating frequency onto the output of oscillator 23 for calibration purposes.

Figure 3:
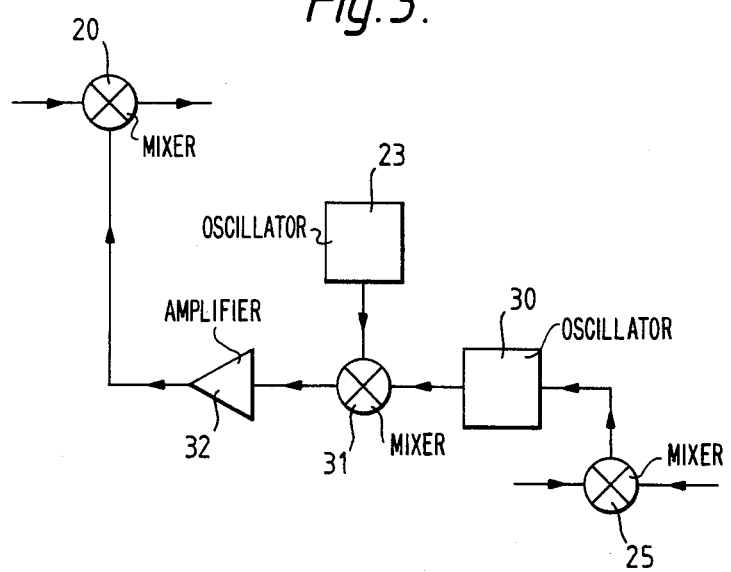
FIG. 3 shows a modification to the apparatus of FIG. 2.

The intermediate-frequency oscillator 23 of FIG. 2 is operated in a dc frequency-modulated mode, and this does not produce the best results in terms of phase noise. The modification illustrated in FIG. 3 improves the phase noise performance by using the phase detector dc output to control a low-frequency voltage-controlled crystal oscillator 30. The output of this oscillator is mixed with the output of intermediate-frequency oscillator 23 by a mixer 31. The resultant signal is amplified by an amplifier 32 and passed to mixer 20 for mixing with the output of source 10. The low frequency oscillator 18 has its outputs applied to the mixer 25 when required.

The intermediate frequency oscillator 23 is adjustable and is tuned with reasonable accuracy to a frequency near to that of the source 10. The voltage-controlled crystal oscillator 30 has an operating range of say 1–100 MHz for an X-band source and operates in the dc frequency-modulated mode. It is, however, operating at a lower frequency than was oscillator 23 in the embodiment of FIG. 2, and hence the phase noise performance is improved. Intermediate-frequency oscillator 23 operates now at a fixed frequency which is chosen to produce a minimum phase noise level. The output of the mixer 31 has to be amplified to compensate for losses in the mixer, and amplifier 32 is used for this purpose. The output of this amplifier is applied to mixer 20 to translate the frequency of the source 11 to that of the cavity 22.

What we claim is:

1. Apparatus for measuring the phase noise content of the output of a microwave signal source, which includes a microwave cavity resonant at a fixed frequency differing from that of the source by between 1% and 10% of the cavity resonant frequency, signal generating means operable to generate a signal representing the difference between the frequency generated by the microwave signal source and the resonant frequency of the cavity, mixing means operable to combine the outputs of the microwave signal source and of the signal generating means to provide a signal having a frequency equal to the resonant frequency of the cavity for application thereto, and phase detector means responsive to an output from the cavity and to an output from the mixing means in phase quadrature therewith to provide a signal representing the phase noise content of the output of the microwave signal source.

2. Apparatus as claimed in claim 1 in which the signal generating means comprise a variable-frequency oscillator the frequency of which is controlled by an output from the phase detector means so as to maintain the output of the mixing means at the resonant frequency of the microwave cavity.

3. Apparatus as claimed in claim 1 in which the signal generating means comprise a fixed frequency oscillator, a voltage-controlled oscillator and second mixing means for combining the outputs of the fixed frequency and voltage controlled oscillation of the voltage-controlled oscillator being controlled by an output from the phase detector means so as to maintain the output of the mixing means at the resonant frequency of the microwave cavity.

4. Apparatus as claimed in claim 2 in which the output of the phase detecting means is applied to the voltage-controlled oscillator by way of further mixing means to which may be applied the output of a low frequency calibration oscillator.

5. Apparatus as claimed in claim 3 in which the output of the phase detecting means is applied to the voltage-controlled oscillator by way of further mixing means to which may be applied the output of a low frequency calibration oscillator.

6. Apparatus as claimed in claim 1 which includes a band-pass filter connected between the mixing means and the microwave cavity and phase-shifting means.

* * * * *